United States Patent [19]
Kimura

[11] Patent Number: 5,574,382
[45] Date of Patent: Nov. 12, 1996

[54] INSPECTION ELECTRODE UNIT FOR PRINTED WIRING BOARD

[75] Inventor: Kiyoshi Kimura, Chiba, Japan

[73] Assignee: Japan Synthetic Rubber Co., Ltd., Tokyo, Japan

[21] Appl. No.: 942,448

[22] Filed: Sep. 9, 1992

[30] Foreign Application Priority Data

Sep. 17, 1991 [JP] Japan .................................. 3-262631
Jun. 8, 1992 [JP] Japan .................................. 4-171484

[51] Int. Cl.⁶ ............................................. G01R 1/04
[52] U.S. Cl. ........................................ 324/754; 324/761
[58] Field of Search ........................... 324/158 F, 158 D, 324/72.5, 761, 158.1, 500, 754; 361/400, 410; 439/482; 174/52.4; 364/550, 551.01

[56] References Cited

U.S. PATENT DOCUMENTS

| | | | |
|---|---|---|---|
| 4,443,756 | 4/1984 | Lightbody et al. | 324/158 F |
| 4,528,500 | 7/1985 | Lightbody et al. | 324/158 F |
| 4,571,542 | 2/1986 | Arai | 324/158 F |
| 4,891,578 | 1/1990 | Doemens | 324/158.1 |
| 4,897,598 | 1/1990 | Doemens et al. | 324/761 |
| 4,939,452 | 7/1990 | Reinholz | 324/761 |
| 4,994,735 | 2/1991 | Leedy | 324/754 |
| 5,307,010 | 4/1994 | Chiu | 437/8 |

FOREIGN PATENT DOCUMENTS 63-243768  10/1988  Japan .

*Primary Examiner*—Vinh P. Nguyen
*Attorney, Agent, or Firm*—Oblon, Spivak, McClelland, Maier & Neustadt, P.C.

[57] ABSTRACT

An inspection electrode unit for printed wiring board, which includes an insulating substrate; an inspection electrode element set up on one side of the substrate in which inspection electrodes are formed at standard grids crosswise arranged and which element has a plurality of functional regions each having the same inspection electrode arrangement; and a connecting material for electrically connecting the inspection electrodes to one another which are placed in the corresponding positions of the plural functional regions, to form commonized electrodes therefore.

4 Claims, 6 Drawing Sheets

FIG. I
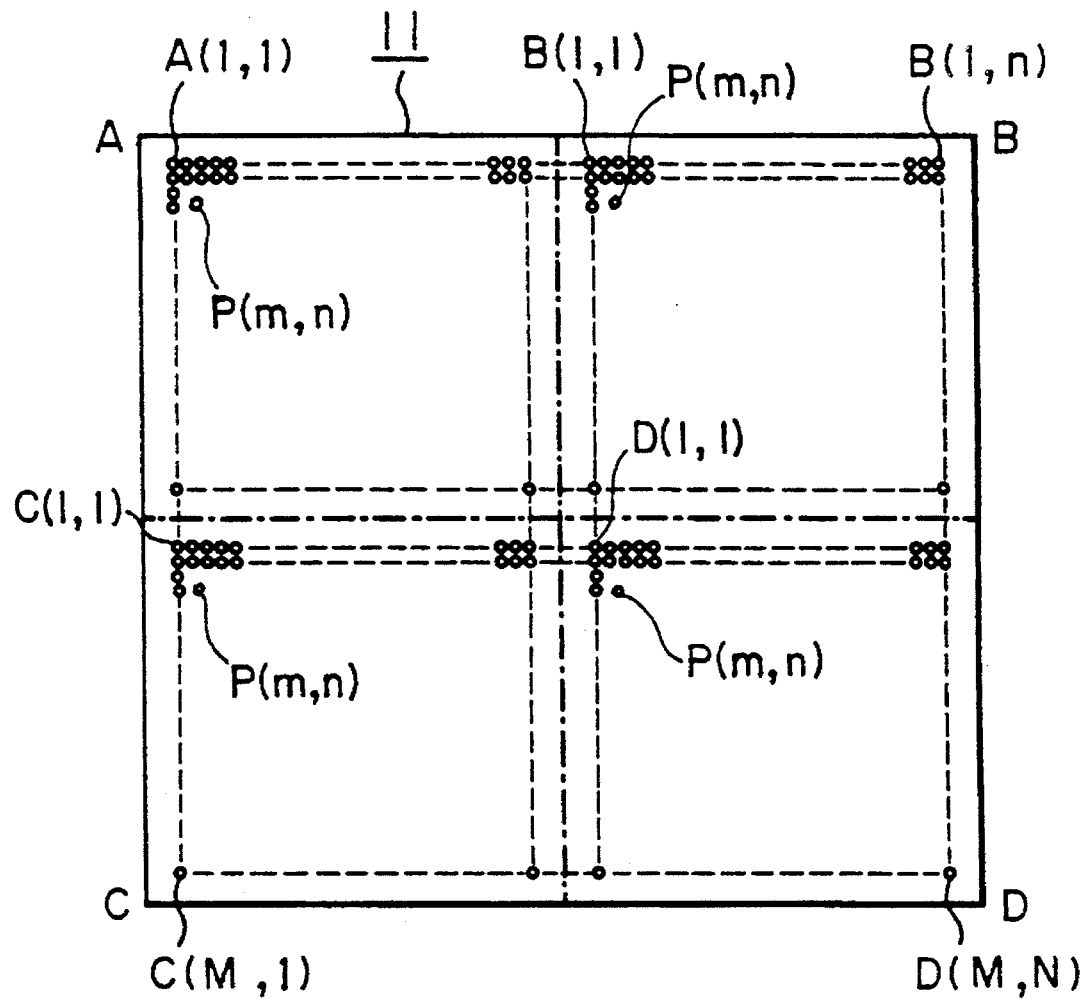
FIG. 2
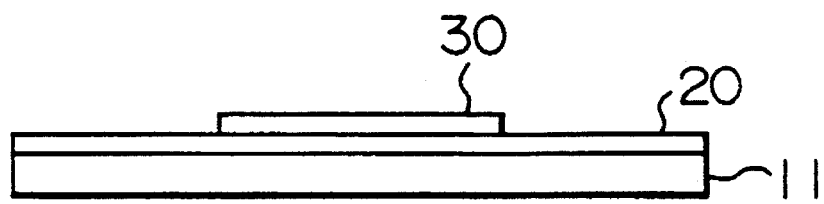

5,574,382

INSPECTION ELECTRODE UNIT FOR PRINTED WIRING BOARD

BACKGROUND OF THE INVENTION

1. Field of the Invention

This invention relates to an inspection electrode unit for printed wiring board, inspection apparatus comprising the inspection electrode unit and a process for inspecting a printed wiring board using the same.

2. Discussion of Background

With respect to printed wiring boards having fabricated therein integrated circuits and the like, in generally, it is necessary to inspect the electric characteristics of the printed wiring boards before fabricating integrated circuits and the like in order to check whether the wiring patterns of the printed wiring boards have the desired performance. Heretofore, in order to carry out the inspection of printed wiring boards, there has been used, basically, an inspection electrode unit of the individually responding type in which inspection electrodes are arranged correspondingly to the patterns of electrodes to be inspected of a printed wiring board and in which the inspection electrodes are electrically connected to the inspection circuits of a tester by means of wirings. Alternatively, a so-called universal type inspection electrode unit in which inspection electrodes are placed at the standard grids arranged crosswise has been used in combination with a connector for connecting the electrodes to be inspected of a printed wiring board to the inspection electrodes of the inspection electrode unit.

Recently, in the field of a printed wiring board, there has been a tendency that the degree of integration of element and the pattern density are being heightened more and more, and as a result, the inspection electrode density of an inspection electrode unit is also being heightened. However, the inspection electrode unit of the individually responding type is required to have inspection electrodes of a pattern corresponding to the electrodes to be inspected of a printed wiring board, and hence, it is finally required that inspection electrodes must be formed at a density as high as in electrodes to be inspected using spring probes though said inspection electrode unit has an advantage that the individually responding type enables the inspection circuit to be utilized more effectively than the universal type. Accordingly, there has been the problem that it is difficult to produce the inspection electrode unit and the cost becomes very high.

In the case of the universal type inspection electrode unit, the distance between adjacent electrodes in pairs to the inspection circuit of a tester is constant, and hence, it is sufficient that a part of the electrodes to be inspected are electrically connected to the inspection electrodes of the unit nearest to the electrodes to be inspected. However, another part of the electrodes to be inspected is often required to be electrically connected to inspection electrodes placed in considerably distant positions. This is because the density of electrodes to be inspected is considerably higher than that of the inspection electrodes. As a result, it becomes necessary to increase the wiring density in connector; however, there is a limit in heightening the density. In fact, there remain many inspection electrodes which cannot effectively be used, and hence, there is the problem that they are inferior in efficiency and have useless parts.

As discussed above, it is difficult for conventional inspection electrode units for printed wiring board to respond well to the desired heightening of the density of electrodes to be inspected. As a result, the construction of inspection electrode unit becomes complicated and it is difficult to sufficiently heighten the density of wiring pattern in a connector for achieving electrical connection. Hence, it is impossible to carry out highly reliable inspection.

SUMMARY OF THE INVENTION

An object of this invention is to provide an inspection electrode unit for printed wiring board having a high electrode density which unit makes it possible to easily achieve highly efficient electrical connection between the electrodes to be inspected of the printed wiring board and the inspection circuit of a tester for checking electric conduction in the printed wiring board and also makes it possible to achieve the necessary inspection of the printed wiring board with high reliability.

Another object of this invention is to provide inspection apparatus for printed wiring board having a high electrode density in which the above-mentioned inspection electrode unit is included and which is basically of the individually responding type and, nevertheless, makes it possible to easily achieve electrical connection to the inspection circuit of a tester with high efficiency and also makes it possible to carry out, with sufficiently high reliability, inspection of a printed wiring board having a high electrode density.

A further object of this invention is to provide inspection apparatus for printed wiring board in which the above-mentioned inspection electrode unit is included and which can easily achieve electrical connection to the inspection circuit of a tester with high efficiency even if the printed wiring board has electrodes to be inspected on both sides and makes it possible to carry out sufficiently reliable inspection of a high density printed wiring board.

A still further object of this invention is to provide an inspection apparatus for printed wiring board in which an inspection mechanism having a different system of electrical connection to the electrodes to be inspected of a printed wiring board can easily be substituted.

A still another object of this invention is to provide a method for inspecting a printed wiring board using the above-mentioned inspection electrode unit.

BRIEF DESCRIPTION OF THE DRAWINGS

Other objects and advantages of this invention will become apparent from the following description and the accompanying drawings in which FIG. 1 is a diagrammatical cross-sectional view of the construction of the inspection electrode element in an example of the inspection electrode unit for printed wiring board of this invention; FIG. 2 is a view for explaining the inspection method of this invention.

DETAILED DESCRIPTION OF THE PREFERRED EMBODIMENTS

Figure 3:
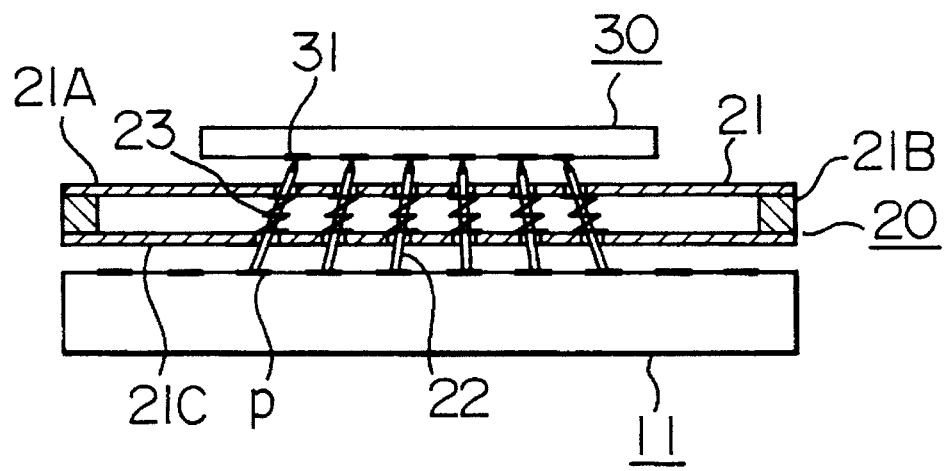
FIG. 3 is a diagrammatical cross-sectional view of the construction of a connector which can be used in this invention.

According to this invention, there is provided an inspection electrode unit for printed wiring board, which consists essentially of an insulating substrate; an inspection electrode element set up on one side of the substrate in which inspection electrodes are formed at the standard grids crosswise arranged and which element has a plurality of functional regions each having the same inspection electrode arrangement; and a connecting material for electrically connecting the inspection electrodes to one another which are placed in the corresponding positions of the plural functional regions, to form commonized electrodes.

According to this invention, there is also provided a method for inspecting a printed wiring board which comprises using the above-mentioned inspection electrode unit for printed wiring board; placing, on the inspection electrode side of the unit, a printed wiring board to be inspected having a region of electrodes to be inspected larger in size than each of the functional regions of the inspection electrode element in the unit on the electrode side of the unit through a connector so that the electrodes to be connected face the electrodes side of the unit; and connecting each of the electrodes to be inspected of the printed wiring board to one of the commonized electrodes of the inspection electrode element by means of the connector, and checking the electric conduction in the printed wiring board in this state by means of the commonized electrodes.

According to this invention, there is still further provided an inspection apparatus for printed wiring board which comprises an off-grid adaptor to be placed on a printed wiring board to be inspected and an inspection head arranged above the off-grid adaptor, characterized in that the off-grid adaptor consists of a pitch-converting board having, on its surface side, surface electrodes corresponding to the electrodes to be inspected of the printed wiring board and, on its back side, back electrodes arranged at grids and electrically connected to the surface electrodes, and an anisotropically electroconductive sheet (referred to hereinafter as the first anisotropically electroconductive sheet); and said inspection head comprises the abovementioned inspection electrode unit for printed wiring board and another anisotropically electroconductive sheet (referred to hereinafter as the second anisotropically electroconductive sheet), the inspection electrodes of the unit being connected to the back electrodes of the pitch-converting board through the second anisotropically electroconductive sheet and arranged in the grid form.

This invention is illustrated below referring to the accompanying drawings.

First of all, the inspection electrode unit for printing wiring board of this invention is explained.

In FIG. 1, on the inspection electrode element provided on one side of a rectangular, plate-like, insulating substrate, inspection electrodes p are formed at the standard grids arranged crosswise according to the so-called universal arrangement. The whole surface region of this inspection electrode element 11 is divided into two in each of the longitudinal and transverse directions to form 4 functional regions A, B, C and D which are the same rectangles (in FIG. 1, they correspond, respectively, to upper left, upper right, lower left and lower right). Each of the functional regions A to D has inspection electrodes p which are crosswise placed in the same arrangement.

Now, in order to indicate a specific electrode among the inspection electrodes p arranged crosswise in m lines and n columns, the address of a specific inspection electrode p placed in the mth line and the nth column is indicated as (m,n) hereinafter and when one of the functional regions is indicated simultaneously, one of the symbols A to D is added to the top of the address. For example, the inspection electrode placed in the first line and the first column of the functional region A is indicated as A(l,l).

The inspection electrodes p at the corresponding positions in the functional regions A to D of the inspection electrode element 11 are electrically connected to one another through a connecting material. That is to say, an inspection electrode p having the same address (m,n) is present in each of the functional regions A to D and the total number thereof is 4. The 4 inspection electrodes p having the same address are electrically connected to one another. The inspection electrodes electrically connected to one another are called a "commonized electrode" and expressed as P(m,n) herein. Accordingly, a certain commonized electrode P(m, n) consists of inspection electrodes A(m,n), B(m,n), C(m,n) and D(m,n) which are electrically connected, and act as 4 branched terminals.

The electrical connection of the inspection electrodes having the same address may be achieved by an appropriate connecting material, and is not restricted to any specific construction or means. For example, a multi-layer wiring circuit can be formed in the insulating substrate on which the inspection electrode element 11 is provided, and used as a connecting material. Also, the connecting material may be composed of an appropriate lead wire.

As shown in FIG. 2, using the inspection electrode unit consisting of the inspection electrode element 11 and the connecting material as mentioned above, inspection of a printed wiring board 30 to be inspected is conducted. That is, the printed wiring board 30 to be inspected is arranged through a connector 20 on the inspection electrode element 11. In this case, the connector 20 has a size capable of covering the whole surface of the inspection electrode element 11, and has, on its side facing the printed wiring board 30 (the upper side in FIG. 2), connection terminals (referred to hereinafter as the first connection terminals) of a pattern corresponding to the electrodes to be inspected of the printed wiring board 30, and on the opposite side, connection terminals (referred to hereinafter as the second connection terminals) to be individually connected to the commonized electrodes of the inspection electrode element 11. In addition, said connector 20 has a connection through which the first connection terminals are electrically connected to the second connection terminals. By placing this connector 20 between the printed wiring board 30 and the inspection electrode element 11, the electrodes to be inspected of the printed wiring board 30 are individually connected to the commonized electrodes of the inspection electrode element 11, and simultaneously, a state is achieved that plural electrodes to be inspected are not commonly connected to one commonized electrode.

A more detailed explanation is made. As shown in, for example, in FIG. 3, the connector 20 is composed of an electroconductive-pin-supporting plate 21 having a size capable of covering the whole surface of the inspection electrode element 11 and many electroconductive pins 22 supported by the electroconductive-pin-supporting plate 21. The electroconductive-pin-supporting plate 21 has an upper plate 21A and a lower plate 21B facing the upper plate 21A through a spacer 21B. The upper plate 21A has through holes at positions corresponding to the electrodes to be inspected of the printed wiring board 30 and at the same time the lower plate 21C has through holes at positions corresponding to the inspection electrodes p commonized in the inspection electrode element 11. The electroconductive pins 22 are free to elongate and shorten elastically by means of built-in springs, and project upward and downward through the through holes formed in the upper plate 21A and the lower plate 21C of the electroconductive-pin-supporting plate 21, for example, in the inclined state and are kept by means of the springs 23 placed in a space between the upper plate 21A and the lower plate 21C so that the pins can move upward and downward resisting to the elastic force of the springs 23.

According to the connector 20 having such a construction, a state is achieved in which the lower end of the electroconductive pin 22 contacts elastically the inspection electrode p and the upper end thereof contacts elastically the electrode 31 to be inspected, whereby electrical connection is achieved between the electrodes 31 to be inspected placed in the inherent pattern of the printed wiring board 30 and the inspection electrodes p placed at standard grids of the inspection electrode element 11. That is to say, the upper and lower ends of each electroconductive pin 22 act as the first and second connection terminals, respectively, in the connector 20.

Figure 4:
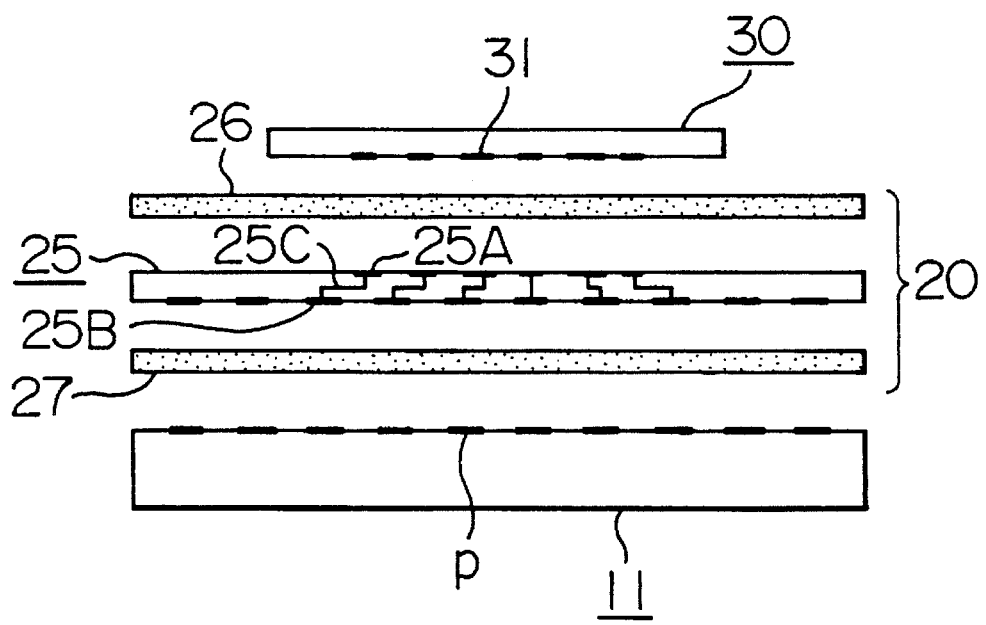
FIG. 4 is a diagrammatical cross-sectional view of the construction of another connector which can be used in this invention.

FIG. 4 shows another example. In this example, the connector 20 is composed of a pitch-converting board 25 having a size capable of covering the whole surface of the inspection electrode element 11; a first anisotropically electroconductive elastomer sheet 26 placed between the pitch-converting board 25 and the printed wiring board 30 to be inspected; and a second anisotropically electroconductive elastomer sheet 27 placed between the pitch-converting board 25 and the inspection electrode element 11.

The pitch-converting board 25 has upper side electrodes 25A arranged on its upper side in the same pattern as the electrodes 31 to be inspected of the printed wiring board 30; lower side electrodes 25B arranged on its lower side at the same standard grids as those of the inspection electrodes p of the inspection electrode element 11; and wirings-in-layer 25C for electrically connecting the upper side electrodes 25A to the lower side electrodes 25B. Also, each of the first anisotropically electroconductive elastomer sheet 26 and the second anisotropically electroconductive sheet 27 has electroconductive path-forming portions in the direction of thickness of the elastomer sheet.

By pressing such a connector 20 between the inspection electrode element 11 and the printed wiring board 30, the electrodes 31 to be inspected of the printed wiring board 30 are electrically connected to the upper side electrodes 25A of the pitch-converting board 25 through the first anisotropically electroconductive elastomer sheet 26, and simultaneously, the inspection electrodes p of the inspection electrode element 11 are electrically connected to the lower side electrodes 25B of the pitch-converting board 25 through the second anisotropically electroconductive elastomer sheet 27. As a result, electrical connection is achieved between the electrodes 31 to be inspected and the inspection electrodes p. That is, in the connector 20, the upper side electrodes 25A and the lower side electrodes 25B act as the first connection terminals and the second connection terminals, respectively.

In the above-mentioned state, the printed wiring board 30 is inspected by means of the commonized electrodes of the inspection electrode element 11. As explained below, when the region in which electrodes to be inspected of the printed wiring board 30 are present is larger in size than each of the functional regions of the inspection electrode element 11, the excellent effect of this invention is actually exhibited.

For an explanation, a case is assumed where the region of electrodes to be inspected of the printed wiring board 30 is the same rectangular as each functional region of the inspection electrode element 11, namely, the dimension of the region of electrodes to be inspected is ½ of the inspection electrode element 11 in both longitudinal and transverse directions, and hence, the size of the region of electrodes to be inspected is ¼ of the inspection electrode element 11. When the printed wiring board 30 is placed at the center of the inspection electrode element 11, as is clear from FIG. 5, the region of electrodes to be inspected of the printed wiring board 30 is divided into two in each of the longitudinal and transverse directions by the boundary lines of the functional regions A to D (dot-and-dash lines in FIG. 5) to form 4 functional regions. These 4 region portions are called inspection region portions, and the upper left portion, upper right portion, lower left portion and lower right portion are expressed as a, b, c and d, respectively. That is, the upper left inspection region portion is indicated as "inspection region portion a".

Assuming that each of the functional regions A to D is divided into two in each of the longitudinal and transverse directions to form 4 region sections (the division is shown by broken lines in FIG. 5), the 4 region sections are called functional region sections, and the upper left, upper right, lower left and lower right region sections are expressed as LU, RU, LD and RD, respectively. Moreover, when the functional regions are to be specified simultaneously, symbols A to D for expressing the functional regions are put in front thereof. For example, the upper left section in the functional region A is expressed as "functional region section ALU, and the lower right section in the functional region D as "functional region section DRD".

Figure 5:
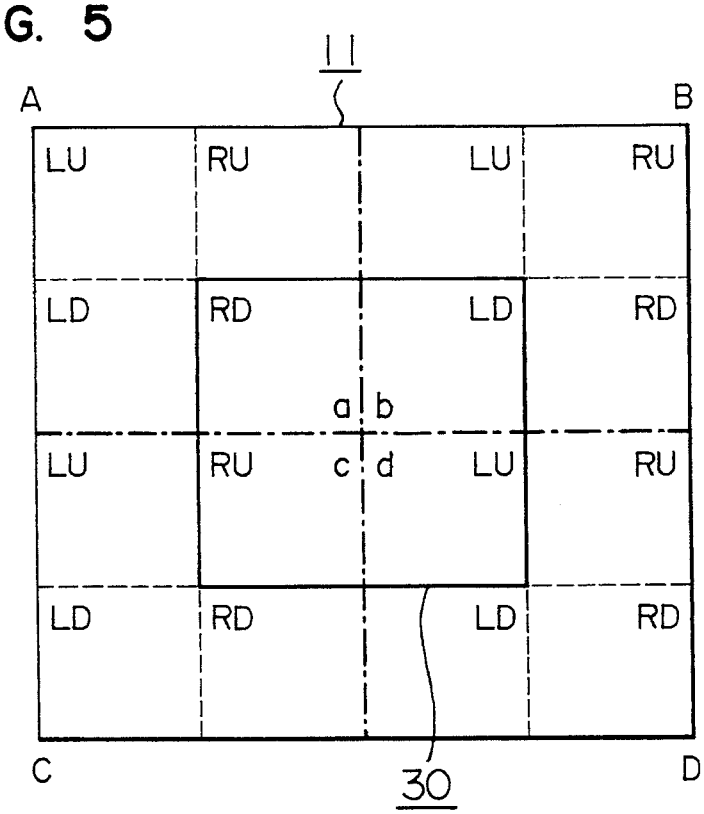
FIG. 5 is a diagrammatical view of the inspection electrode element of an example of the inspection electrode unit of this invention in which the region of electrodes to be inspected is the same in size as the functional region of the inspection electrode element.

Under the above-mentioned conditions, FIG. 5 is explained below. In the above-mentioned state, the inspection region portion a is positioned in the functional region section ARD, the inspection region portion b in the functional region section BLD, the inspection region portion c in the functional region section CRU, and the inspection region portion d in the functional region section DLU. However, in each of the functional regions A to D, the inspection electrodes p are electrically connected to one another, and hence, the functional region sections LU in all the functional regions A to D, namely 4 functional region sections ALU, BLU, CLU and DLU, are equivalent to one another. The same is applied to the functional region sections RU, LD and RD in all the functional regions A to D.

Figure 6:
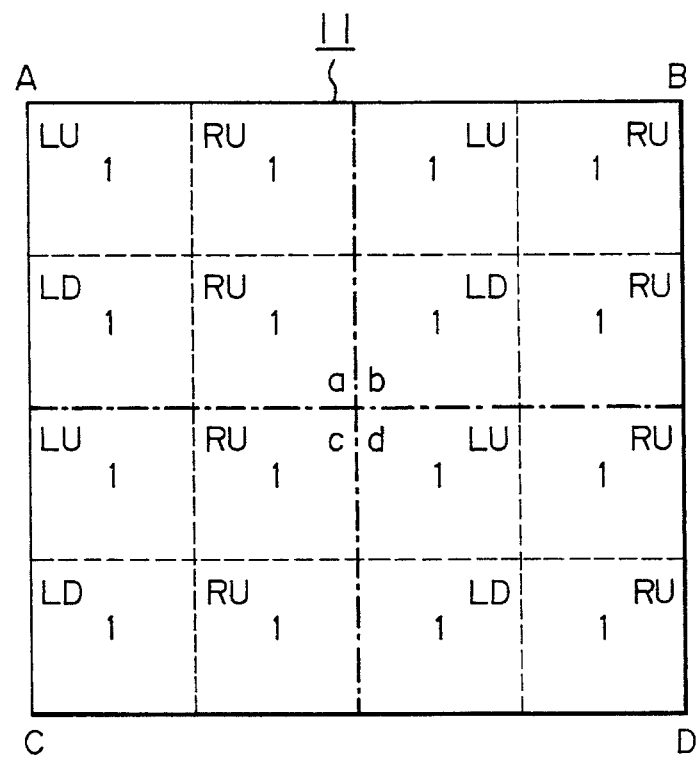
FIG. 6 is a view for explaining the average inspection electrode density on the inspection electrode element of FIG. 5.

The above-mentioned state is the state that assuming the average inspection electrode density in the region of electrodes to be inspected of the printed wiring board 30 as α, the average inspection electrode density in the whole of the inspection electrode element 11 in which the electrical connection state is considered becomes an equimultiple thereof, namely 1α. FIG. 6 shows the state of this average inspection electrode density. The numerals shown in each region portion indicate a multiple of α. As can be seen from FIG. 6, in this state, in all the regions, the average inspection electrode density is 1α, and this is completely equal to the state that the region of electrodes to be inspected of the printed wiring board is connected correspondingly to one functional region only of the inspection electrode element 11, and accordingly, in this case, the advantage of this invention does not appear as an actual effect.

Figure 7:
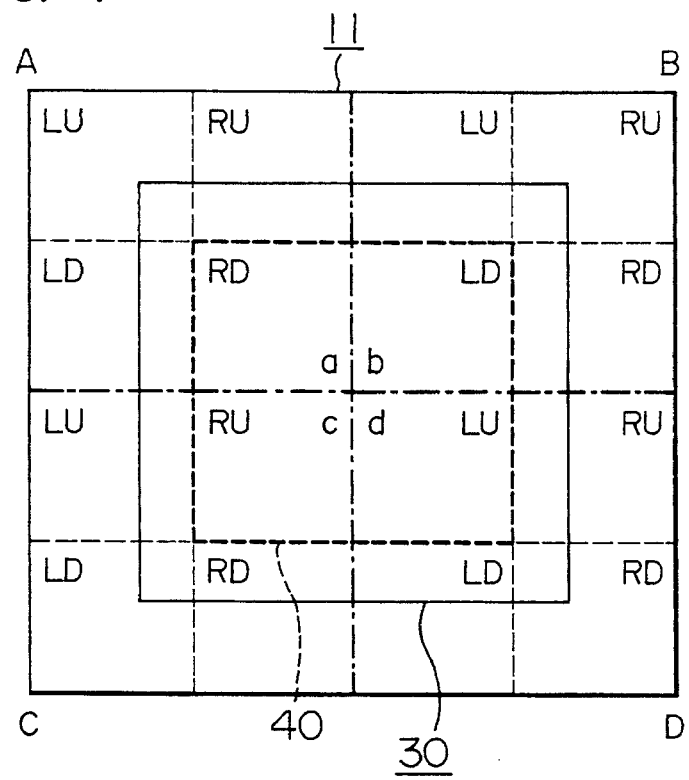
FIG. 7 is a diagrammatical view of the inspection electrode element of an example of the present inspection electrode unit in which the region of electrodes to be inspected is larger in size than the functional region of the inspection electrode element.

However, when the region of electrodes to be inspected of the printed wiring board 30 is larger in size than each functional region as shown in FIG. 7, it follows that the region of electrodes to be inspected is also present in the functional region sections surrounding the basic region 40 (the region surrounded by thick broken lines in FIG. 7 and this is equal to the region of electrodes to be inspected of the printed wiring board 30 in FIG. 5) occupied by the 4 functional region sections ARD, BLD, CRU and DLU which belong to the functional regions A to D and positioned at the center.

Figure 8:
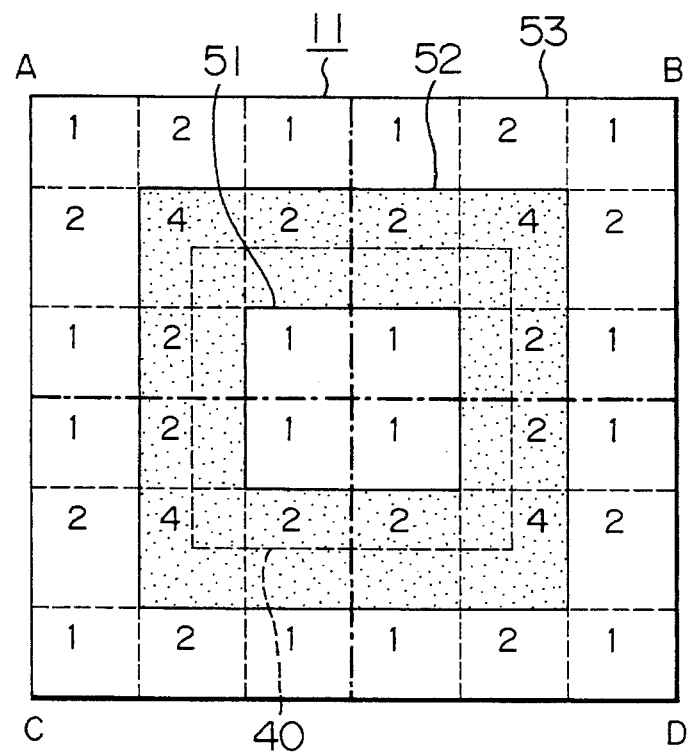
FIG. 8 is a view for explaining the average inspection electrode density on the inspection electrode element of FIG. 7.

The state of average inspection electrode density in this case is, as shown in FIG. 8, the state that there are the central portion 51 surrounded by solid lines in which the average inspection electrode density is 1α, the intermediate flame portion 52 highlighted by netlike points in which the average inspection electrode density is 2α or 4α, and the peripheral portion 53 positioned on the outer side of the intermediate flame portion 52 in which the average inspection electrode density is 1α or 2α. The central portion 51 is smaller in size than the basic region 40.

The average inspection electrode density is explained in more detail below. In FIG. 8, each of the functional regions A to D is divided into 3 in each of the longitudinal and transverse directions. In this case, in common to the functional regions A to D, each of the divided regions in the longitudinal direction are expressed as "top", "middle" and "bottom" in order from the top, and each of the divided regions in the transverse direction are expressed as "left", "center" and "right" in order from the left side. In the total 4 top left sections of each of the functional regions A to D, the region of electrodes to be inspected is directly placed in only the functional region D. Accordingly, the average inspection electrode density in the total 4 top left sections is 1α in each of the functional regions A to D. Similarly, in the total 4 top right sections, the region of electrodes to be inspected is directly in only the functional region C, and in the total 4 bottom left sections, the region of electrodes to be inspected is directly placed in only the functional region B. In the total 4 bottom right sections, the region of electrodes to be inspected is directly placed in only the functional region A. Accordingly, the average inspection electrode density in each of these sections becomes 1α.

The total 4 top center sections in each of the functional regions A to D, the region of electrodes to be inspected is directly placed in the functional regions C and D, and accordingly, the average inspection density of the 4 top center sections is 2α in each of the functional regions A to D. Similarly, in the total 4 bottom center sections, the region of electrodes to be inspected is directly placed in the functional regions A and B, and in the total 4 middle left sections, the region of electrodes to be inspected is directly placed in the functional regions B and D. In the total 4 middle right sections, the region of electrodes to be inspected is directly placed in the functional regions A and C. Hence, the average inspection electrode densities in these sections are all 2α.

On the other hand, in the total 4 middle center sections, the region of electrodes to be inspected is directly placed in all the functional regions A to D, and the average inspection electrode densities in the middle center sections are all 4α. Thus, the distribution of average inspection electrode density in each of the functional regions A to D becomes the same.

The average inspection electrode density state in the above-mentioned inspection electrode element 11 is such that when the longitudinal and transverse dimensions of the region of electrodes to be inspected of the printed wiring board are increased, the width of each of the longitudinal and transverse peripheral portions 53 becomes correspondingly small and simultaneously the crosswise dimensions of the central portion 51 become small, while the width of each of the longitudinal and transverse intermediate flame portions 52 becomes correspondingly large. In this case, in the intermediate flame portion 52, the crosswise dimensions of each of the 4 middle center portions in which the average inspection electrode density is 4α become large, and when the crosswise dimensions of the region of electrodes to be inspected of the printed wiring board 30 becomes the same as those of the inspection electrode element 11, it follows that the middle center section in each of the functional regions A to D occupies the whole of the corresponding functional region, and as a result, the average inspection electrode density in the whole region becomes 4α.

When the region of electrodes to be inspected of the printed wiring board 30 is smaller in size than the whole of the inspection electrode element 11 but larger in size than each of the functional regions as mentioned above, the central portion 51 having a low average inspection electrode density and the peripheral portion 53 having a relatively low average inspection electrode density are necessarily formed through the intermediate flame portion 52 having a relatively high average inspection electrode density on the inspection electrode element 11. Accordingly, by use of the inspection electrodes positioned in the central portion 51 having a low average inspection electrode density and the peripheral portion 53, the electrodes to be inspected can be electrically connected individually to the commonized electrodes of the inspection electrode element 11 in a great degree of freedom and with ease. That is to say, since it follows that the region of electrodes to be inspected of the printed wiring board 30 is arranged so that it overlaps simultaneously with each of the 4 functional regions A to D, it is sufficient that the commonized electrode which is nearest to the electrode to be inspected or relatively near but easy to electrically connect is selected and the electrode to be inspected is electrically connected to the selected commonized electrode. In particular, the commonized electrode P(m,n) consists of inspection electrodes A(m,n), B(m,n), C(m,n) and D(m,n) which act as equivalent terminals, and hence, any of the inspection electrodes may be utilized for electrical connection. Therefore, a very great degree of freedom can be obtained. Since the utilization efficiency of the whole inspection electrodes p becomes high so that the number of the useless inspection electrodes is greatly reduced and the inspection can be effected in a very high efficiency.

An example of the inspection electrode unit of this invention is explained above referring to an inspection electrode unit having an inspection electrode element having 4 functional regions which are adjacent to one another on the upper, lower, left and right sides. The number of the functional regions, however, is not critical in this invention, and any plural number of functional regions may be used. However, it can be said to be ideal that the number of the functional regions is $4^n$ (n is an integer of 1 or more) as in the abovementioned example, because the printed wiring board is usually rectangular and when the number of functional regions is increased the connecting material for electrically connecting the corresponding inspection electrodes in each functional region is required to have a complicated construction. However, the inspection electrode element has the same effect even if it has two functional regions which are arranged longitudinally or transversely or three functional regions in each of the longitudinal and transverse directions. When the printed wiring board has electrodes to be inspected on both sides, it is possible to apply the inspection electrode unit of this invention to both sides of the printed wiring board, and the inspection electrode elements of the two inspection electrode units applied to both sides of the printed wiring board can be handled similarly as commonized electrodes.

Next, the inspection apparatus for printed wiring board of this invention is explained. The inspection apparatus comprises an off-grid adaptor to be placed on a printed wiring bard to be inspected and an inspection head placed on the off-grid adaptor.

The off-grid adaptor consists essentially of a pitch-converting board having, on its surface side, surface electrodes of a pattern corresponding to the electrodes to be inspected of the printed wiring board and, on its back side, back electrodes which are placed at the grids and electrically connected to the surface electrodes, and an anisotropically electroconductive sheet (referred to hereinafter as the first anisotropically electroconductive sheet) to be placed between the pitch-converting board and the printed wiring board to be inspected.

The above inspection head comprises an anisotropically electroconductive sheet (referred to hereinafter as the second anisotropically electroconductive sheet) and the above-mentioned inspection electrode unit having inspection electrodes which are placed in a grid arrangement and electrically connected to the back electrodes of the pitch-converting board through the second anisotropically electroconductive sheet.

When a printed wiring board having electrodes to be inspected is intended to be inspected by the inspection apparatus for printed wiring board of this invention, this apparatus can be provided with two sets of the off-grid adaptor and the inspection head correspondingly to both sides of the printed wiring board to be inspected. The commonized electrode in the inspection electrode unit for the inspection head facing one side of the printed wiring board is electrically connected to the commonized electrode in the inspection electrode unit for the inspection head facing the other side of the printed wiring board, and the inspection electrodes for the two commonized electrodes which are electrically connected to each other are placed in an area in one of the inspection electrode units and an area in the other, these areas being in such a relation that they do not overlap each other.

If the inspection apparatus is constructed as mentioned above, an inspection electrode electrically connected to a certain electrode to be inspected of a printed wiring board is present in all the plural functional regions of the inspection electrode unit, and hence, the electrical connection between the electrode to be inspected and the inspection circuit of a tester can be carried out in a very great degree of freedom. Simultaneously, the number of terminals to be connected to the inspection circuit of the tester is greatly reduced and the utilization efficiency of the whole inspection electrodes can be enhanced by commonizing the inspection electrodes in each functional region.

Also, by electrically connecting the inspection electrodes constituting the commonized electrodes placed in areas of the two inspection electrode units placed on both sides of a printed wiring board to be inspected, said areas being in such a relating that they do not overlap each other, a greater degree of freedom can be given the electrical connection between one of the inspection electrode units and the inspection circuit of tester, and the number of connections to the inspection circuit can be reduced.

Moreover, when the above-mentioned inspection head is mounted on a pressing mechanism so as to be free to mount and demount, the inspection head and the off-grid adaptor can be demounted, and hence, another inspection mechanism different in electrical connection system to electrodes to be inspected of a printed wiring board can be easily substituted therefor.

Next, the inspection apparatus of this invention is explained in more detail referring to the accompanying drawings.

Figure 9:
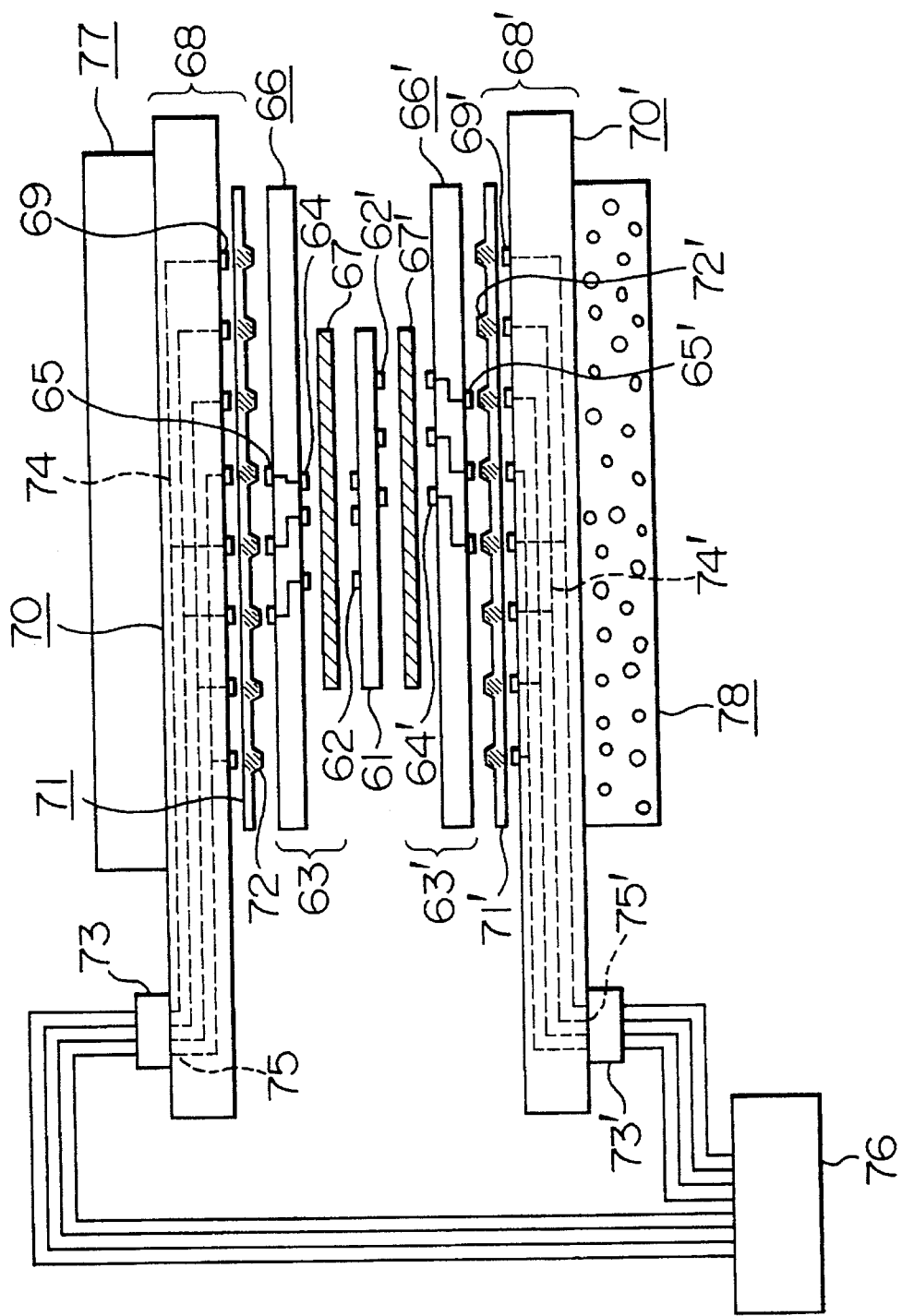
FIG. 9 is a diagrammatical view of the construction of an inspection electrode element which can be used in the present inspection apparatus.

FIG. 9 is an explanatory cross-sectional view of the construction of the essential portion in an example of the inspection apparatus for printed wiring board of this invention. In FIG. 9, 61 is a printed wiring board to be inspected which has electrodes 62 to be inspected on both sides. On the upper and lower sides of the printed circuit board 61, inspection heads 68 and 68' are placed through off-grid adaptors 63 and 63', respectively.

The off-grid adaptor 63 or 63' is composed, respectively, of a pitch-converting board 66 or 66' and an anisotropically electroconductive sheet 67 or 67' (referred to hereinafter as the inner anisotropically electroconductive sheet) placed between the pitch-converting board 66 or 66' and the printed wiring board 61. The pitch-converting board 66 or 66' has, on its surface side facing the printed wiring board 61, surface electrodes 64 or 64', respectively, having a pattern corresponding to the electrodes 62 or 62', respectively, of the printed wiring board 61. Also, the pitch-converting board 66 or 66' has back electrodes 65 or 65' electrically connected, respectively, to the surface electrodes 64 or 64' in the state that the back electrodes are arranged on the grids.

The inspection head 68 or 68' is composed, respectively, of an inspection electrode unit 70 or 70' and an anisotropically electroconductive sheet 71 or 71' (referred to hereinafter as the outer anisotropically electroconductive sheet) placed between the inspection electrode unit 70 or 70' and the pitch-converting board 66 or 66', respectively, and the inspection electrode unit 70 or 70' has, on its surface side, inspection electrodes 69 or 69' formed in a grid arrangement matching to the back electrodes 65 or 65', respectively, of the pitch-converting board 66 or 66', namely in an arrangement in which the electrodes are placed on all grids. In each of the inspection electrode units 70 and 70', a wiring circuit 74 or 74' having a multilayer structure is formed, respectively, for commonizing the inspection electrodes 69 or 69' in order to reduce the number of inspection points correspondingly to the number of electrodes of the inspection circuit of a tester as described hereinafter, and simultaneously, a lead terminal portion 75 or 75' is formed at one end of the inspection electrode unit 70 or 70', respectively, by means of a part of the wiring circuit 74 or 74', and the terminal of the lead terminal portion 75 or 75' is connected to the inspection circuit 76 of a tester by means of a connector 73 or 73', respectively, which connector is connected free to mount and demount.

77 is a press plate for pressing the inspection electrode unit 70 of the upper side inspection head 68 downward, and is mounted free to mount and demount on a pressing mechanism which is not shown in the figure. Also, the press plate 77 is mounted so that the base level in the pressing direction (downward in FIG. 9), namely the base level before starting the pressing operation, can be controlled. An accepting plate 78 consisting of an elastic cushion is placed below the lower side of the inspection electrode unit 70' of the lower side inspection head 68'.

Each of the inspection electrode units 70 and 70' of the inspection heads 68 and 68' has an inspection electrode element 11 as illustrated hereinbefore referring to FIGS. 1, 5, 6, 7 and 8. The inspection electrode element 11 has, on its surface, inspection electrodes p which are formed on the crosswise arranged standard grids according to the so-called universal arrangement. The inspection electrode element 11 has 4 functional regions A, B, C and D (upper left, upper right, lower left and lower right in FIG. 1) which are the same rectangles, formed by dividing the whole surface region of the inspection electrode element into two in each of the longitudinal and transverse directions as shown by dot-and-dash lines in FIG. 1. Each of the functional regions A to D has inspection electrodes p which are arranged crosswise in the same arrangement as one another.

Now, in each of the functional regions A to D, in order to indicate a specific electrode among the inspection electrodes p arranged crosswise in m lines and n columns, the address of a specific inspection electrode p placed in the mth line and the nth column is indicted as (m,n) and when one of the functional regions is indicated simultaneously, one of the symbols A to D is added to the top of the address. For example, the inspection electrode placed in the first line and the first column of the functional region A is indicated as A(1,1).

The inspection electrodes p at the corresponding positions in the functional regions A to D of the inspection electrode element 11 are electrically connected to one another by means of a connecting material. That is to say, an inspection electrode p having the same address (m,n) is present in each of the functional regions A to D and the total number thereof is 4. The 4 inspection electrodes p having the same address are electrically connected to one another. The inspection electrodes electrically connected to one another are called a "commonized electrode" and expressed as P(m,n) herein. Accordingly, a certain commonized electrode P(m,n) consists of inspection electrodes A(m,n), B(m,n), C(m,n) and D(m,n) which are electrically connected and act as 4 branched terminals.

The electrical connection of the inspection electrodes having the same address may be achieved by using an appropriate connecting material, and is not restricted to any specific construction or means. In the inspection electrode unit 70 or 70' in FIG. 9, the connecting material is a wiring circuit 74 or 74' formed in multilayer in the insulating substrate on which the inspection electrode element 11 is formed, as mentioned above. However, the connecting material may be composed of an appropriate lead wire. The inspection electrodes p of the inspection electrode element 11 act as inspection electrodes 69 or 69' of the inspection electrode unit 70 or 70'.

The inner anisotropically electroconductive sheet 67 or 67' and the outer anisotropically electroconductive sheet 71 or 71' in FIG. 9 have an electroconductivity in the thickness direction of each of the sheets. In the outer anisotropically electroconductive sheet 71 or 71', many electroconductive path-forming portions 72 or 72' which are arranged at positions corresponding to the inspection electrodes 69 or 69' of the insection head 68 or 68' are formed in the form of projections in the thickness direction on at least one surface, and have a function of enhancing the electrical connection stability.

In the inspection apparatus for printed wiring board having the above-mentioned construction, each of the electrodes to be inspected 62 or 62' of the printed wiring board 61 is electrically connected to any of the inspection electrodes 69 or 69' of the inspection head 68 or 68' by pressing the printed wiring board 61 to be inspected through the off-grid adaptor 63 or 63' and the inspection head 68 or 68' present between the pressing plate and the accepting plate in the press mechanism, whereby it follows that the electrodes to be inspected are electrically connected to the inspection circuit of a tester and the desired inspection is effected. Since the elastic cushion is used as the accepting plate 78, in the above-mentioned pressing state, the pressing force applied to the inspection heads 68 and 68' and the off-grid adaptors 63 and 63' by the pressing plate 77 has a uniform pressure distribution over the whole.

In the inspection head 68 or 68' and the inspection electrode unit 70 or 70', inspection electrodes 21 or 21' are formed in the same arrangement state in plural functional regions, and simultaneously, the inspection electrodes 21 or 21' present in the corresponding positions of the functional regions are electrically connected to one another by means of the wiring circuit 74 or 74' to form a commonized electrode. Hence, the inspection electrode 69 or 69' which is electrically connected with the electrodes 62 or 62' to be inspected is present in each of the functional regions, and accordingly, electrical connection to the inspection circuit 76 of a tester can be conducted in a great degree of freedom. In addition, the number of terminals to be connected to the inspection circuit 76 of a tester may be the same as that of the commonized electrodes, so that the number of terminals is greatly reduced as compared with the total number of inspection electrodes 69 or 69'. As a result, even if the electrodes 62 or 62' to be inspected of the printed wiring board 61 are formed in a very high density state in a specific place, the desired electrical connection can be easily achieved by utilizing the commonized electrodes in a functional region far from the specific place, namely, inspection electrodes present in positions dispersed by the commonized electrodes, and simultaneously, inspection with a high reliability can be carried out.

Figure 10:
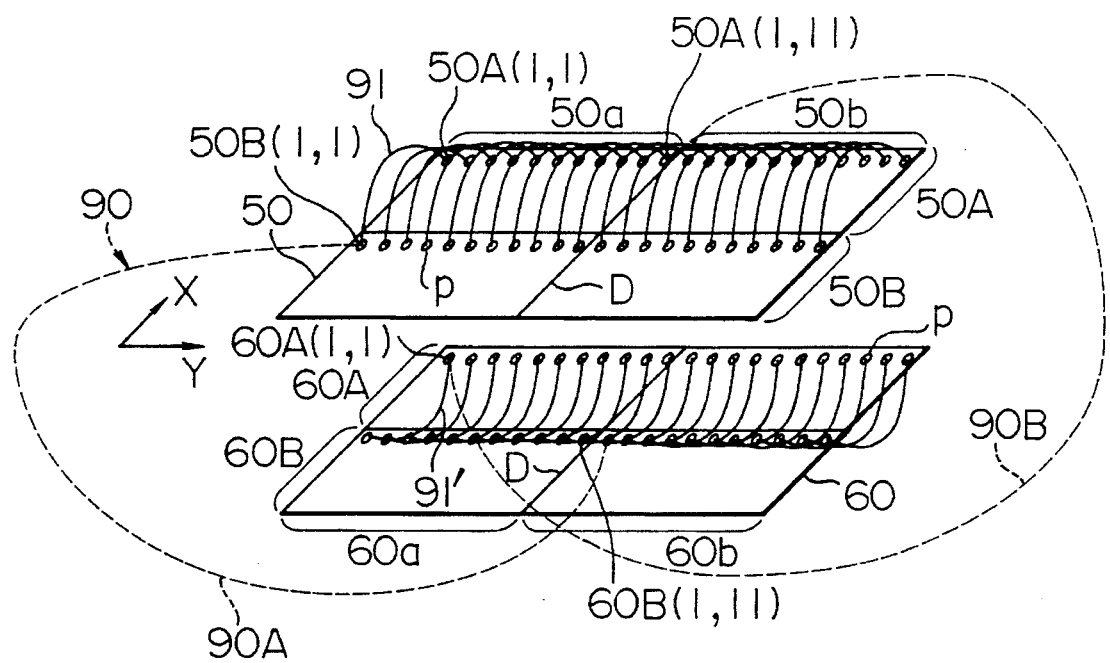
FIG. 10 is a diagrammatical view of the construction of an inspection electrode element which can be used in the present inspection apparatus.

FIG. 10 shows another example of the inspection electrode element of this invention. In FIG. 10, there are shown only the inspection electrode element of an inspection electrode unit to be arranged on the upper side of the printed wiring board 61 shown in FIG. 9; the inspection electrode element of another inspection electrode unit to be arranged on the lower side of the printed wiring board 61; and their relative portions. In the example of FIG. 10, the inspection electrode element 50 has two functional regions 50A and 50B which are arranged in one direction (the X direction in FIG. 10), and each of the functional regions 50A and 50B has inspection electrodes p formed in the same arrangement state. The inspection electrodes p present in the same position of each of the functional region 50A and 50B, for example, the inspection electrode 50A(1,1) of the functional region 50A and the inspection electrode 50B(1,1) of the functional region 50B, are electrically connected to each other by means of a connecting material 91. In FIG. 10, the connecting material 91 is shown as if it is composed of a wire; however, it is preferable in practice that the connecting material be a multilayer wiring circuit as mentioned hereinbefore.

The inspection electrode element 60 has two functional regions 60A and 60B which are arranged in the X direction as in the case of the inspection electrode element 50, and the inspection electrodes p present in the same position of each of the functional regions 60A and 60B are electrically connected to each other by means of a connecting material 91'.

Each of the commonized electrodes of the inspection electrode element 50 is electrically connected to the corresponding commonized electrode of the inspection electrode element 60 by means of a second connecting material 90. Inspection electrodes constituting the two commonized electrodes thus electrically connected to each other by means of the second connecting material 90 are positioned in areas which do not overlap each other in the inspection electrode element 50 and the inspection electrode element 60.

For example, in FIG. 10, the inspection electrode element 50 is divided into areas 50a and 50b which are the same as each other and are arranged in the Y direction perpendicular to the X direction, as shown by the dividing line D and the inspection electrode element 60 is also divided similarly into two areas 60a and 60b which are the same as each other and are arranged in the Y direction. In this case, in the example of FIG. 10, each area is shown so as to have 11 inspection electrodes p for explanation.

In the area 50a of the inspection electrode element 50 and the area 60b of the inspection electrode element 60 which does not overlap the area 50a, and also in the area 50b and the area 60b which do not overlap each other, the inspection electrodes p constituting the commonized electrodes in the corresponding positions are electrically connected to each other. In FIG. 10, the inspection electrode 50B(1,1) which belongs to the functional region 50B and to the area 50a and the inspection electrode 60B(1,1) which belongs to the functional region 60B and to the area 60b are electrically connected to each other by means of the connecting material 90A. Also, the inspection electrode 50A(1,1) belonging to the functional region 50A and to the area 50a and the inspection electrode 60A(1,1) belonging to the functional region 60A and to the area 60a are electrically connected to each other by means of the connecting material 90B. And, other inspection electrodes p are also electrically connected in the same manner as above by means of the second connecting material 90.

In the example of FIG. 10, the number of the functional areas in each of the inspection electrode elements 50 and 60 is 2, and the corresponding inspection electrodes are electrically connected to each other between the functional regions. Moreover, the inspection electrodes constituting the commonized electrodes in the areas which do not overlap each other are electrically connected to each other. Therefore, even in this respect, according to the same principle as in the above-mentioned commonized electrodes, a great degree of freedom is obtained in electrically connecting one inspection electrode p to the inspection circuit 76 of the tester in FIG. 9, and simultaneously, the number of connections to the inspection circuit 76 can be reduced.

In the example of FIG. 10, the number of functional regions in each of the inspection electrode elements 50 and 60 is 2, so that the connecting materials 91 and 91' for electrically connecting the corresponding inspection electrodes to each other between the two functional regions are easily arranged and this arrangement can be easily realized as a multilayer wiring circuit.

In FIG. 10, the actual electrical connection by means of the second connecting material 90 can be carried out in wiring of electric paths to the inspection circuit 76 of the tester in FIG. 9. That is, the wiring from the inspection electrode element 50 to the inspection circuit 76 of the tester of FIG. 9 may be connected at an appropriate position with the wiring from the inspection electrode element 60 to the inspection circuit 76 of the tester in FIG. 9. Moreover, this electrical connection can be realized in the inspection circuit 76 of the tester. When the electrical connection by means of the second connecting material is achieved in the wiring, it is actually unnecessary to place the second connecting material between the two inspection electrode elements, so that it is avoidable to complicate the construction in the space between the upper and lower inspection heads 68 and 68'.

As mentioned above, by mounting the pressing plate for pressing downward the inspection electrode unit 70 of the upper side inspection head 68 constituting the inspection apparatus in FIG. 9 on the pressing mechanism free to mount and demount, it is made possible to demount the inspection head 68 and the off-grid adaptor 63, and hence, an inspection mechanism different in electrical connection system to electrodes to be inspected of a printed wiring board can be substituted therefor, and the benefit of such an inspection mechanism can be utilized effectively.

Figure 11:
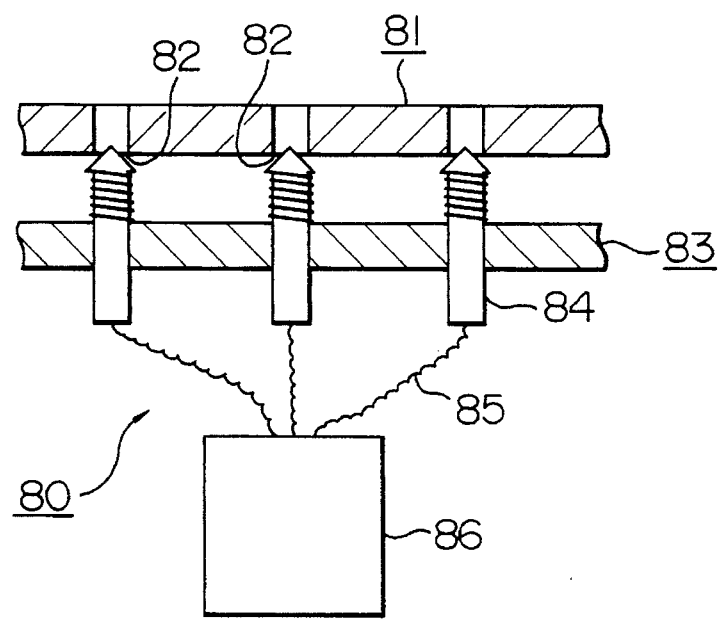
FIG. 11 is a diagrammatical view of the construction of an individually responding type inspection mechanism which can be used in the present inspection apparatus.

For example, as shown in FIG. 11, there is widely used an individually responding type inspection mechanism 80 in which spring probes 84 are arranged correspondingly to the arrangement pattern of the electrodes 82 to be inspected of a printed wiring board 81 in the terminal-supporting plate 83 and the spring probes 84 are electrically connected by wirings 85 to the inspection circuit 86 of a tester. This individually responding type inspection mechanism 80 can easily be substituted for the inspection head 68 and the off-grid adaptor 63, whereby it is avoidable to make the existing facilities useless or scrap them.

When such other inspection mechanisms different in electrical connection system are substituted, if the press plate 27 in FIG. 9 is placed so that the base level in the pressing direction (downward in the figure) can be controlled, said other inspection mechanisms can be used with sufficient reliability even if the whole thickness of the inspection mechanism is different from the inspection head and the off-grid adaptor. Furthermore, if the connector 73 is also mounted so as to be free to mount and demount, the connection mechanism to the inspection circuit of a tester can also be commonly used.

The anisotropically electroconductive sheet is an elastomer sheet consisting of an appropriate material in which many electroconductive-path-forming portions are formed in which portions electroconductive particles are dispersed in the oriented state. However, other elastic electroconductive sheets may be used. There may be used, for example, elastomer sheets in which electroconductive particles are merely dispersed or dispersed and oriented in the form of columns in the thickness direction. In particular, in view of contact stability, there can preferably be used electroconductive elastomer sheets in which a plurality of electroconductive portions formed by densely filling an insulating, elastic, high polymer with electroconductive particles are insulated with one another by the insulating high polymer and project from the outer surface of the insulating portion, whereby many electroconductive paths are formed in the thickness direction. The electroconductive elastomer sheet may be a pressure-sensitive electroconductive sheet in which when it is pressed in the thickness direction electroconductive paths are formed in its direction. The electroconductive particles includes particles of metals exhibiting magnetism, such as nickel, iron, cobalt and the like which may be plated with gold, silver, rhodium or the like; particles of alloys of these metals which may be plated with gold, silver, rhodium or the like; and particles of non-magnetic metals, inorganic materials such as glass or the like or polymers plated with an electroconductive, magnetic metal such as nickel, cobalt or the like. The particle diameters of these particles are preferably 3 to 200 μm, more preferably 10 to 100 μm.

What is claimed is:

1. An inspection electrode unit for printed wiring board, comprising:

an insulating substrate;

an inspection electrode element set up on one side of the substrate in which inspection electrodes are formed at standard grids crosswise arranged and which element has a plurality of functional regions each having a plurality of inspection electrodes identically positioned in each of said plurality of functional regions; and a connecting material through which correspondingly positioned ones of said inspection electrodes of said plural functional regions are connected together, to form commonized electrodes, wherein the identical positioning of said plurality of inspection electrodes in said plurality of functional regions allows for inspection of said printed wiring board so that individual printed wiring board electrodes to be inspected are individually connected to said commonized electrodes.

2. The inspection electrode unit according to claim 1, wherein the number of the functional regions is $4^n$ in which n is an integer of 1 or more.

3. The inspection electrode unit according to claim 2, wherein n is 1.

4. The inspection electrode unit according to claim 1, wherein the connecting material is a multilayer wiring circuit provided in the insulating substrate.

* * * * *